(12) United States Patent
Hosoda

(10) Patent No.: US 6,518,076 B2
(45) Date of Patent: Feb. 11, 2003

(54) SEMICONDUCTOR LASER DEVICE AND MANUFACTURING METHOD OF THE SAME

(75) Inventor: Tetsuya Hosoda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/364,582

(22) Filed: Jul. 30, 1999

(65) Prior Publication Data

US 2002/0187576 A1 Dec. 12, 2002

(30) Foreign Application Priority Data

Aug. 5, 1998 (JP) ............................................ 10-221194

(51) Int. Cl.[7] ................................................ H01L 21/36
(52) U.S. Cl. ............................ 438/22; 438/44; 438/483
(58) Field of Search .............................. 438/21, 22, 24, 438/39, 40, 41, 46, 478, 483

(56) References Cited

FOREIGN PATENT DOCUMENTS

| JP | 7-254750 | | 10/1995 |
| JP | 8-148752 | | 6/1996 |
| JP | 8-330676 | | 12/1996 |
| JP | 9-266349 | | 10/1997 |
| JP | 10-189456 | | 7/1998 |
| JP | 11-112102 | * | 4/1999 |

\* cited by examiner

*Primary Examiner*—Savitri Mulpuri
(74) *Attorney, Agent, or Firm*—Katten, Muchin, Zavi, Rosenman

(57) ABSTRACT

A semiconductor laser device includes an active layer formed on a substrate, and current blocking layers formed on the substrate so as to sandwich the active layer. Each current blocking layer has a low impurity concentration at a portion near the active layer and a high impurity concentration at a portion apart from the active layer. A manufacturing method of the semiconductor laser device is also disclosed.

4 Claims, 3 Drawing Sheets

HEAVILY DOPED REGION

LIGHTLY DOPED REGION

HEAVILY DOPED REGION

SEMICONDUCTOR LASER DEVICE AND MANUFACTURING METHOD OF THE SAME

BACKGROUND OF THE INVENTION

1. Field of the Invention

The present invention relates to a semiconductor laser device and a manufacturing method of the same and, more particularly, to a high-output semiconductor laser device and a manufacturing method of the same.

2. Description of the Prior Art

As shown in FIG. 1A, a conventional semiconductor laser is formed by selectively stacking an n-InP cladding layer 22, i-InGaAsP active layer 23, and p-InP cladding layer 24 on an n-InP substrate 21, selectively growing p-InP current blocking layers 25 and n-InP current blocking layers 26 constituting a pnpn thyristor structure on the two sides of the stacked structure, and forming a p-InP over cladding layer 27 and p-InGaAs capping layer 28 on the n-InP current blocking layers 26. In this semiconductor laser, the current blocking layers 25 formed on the two sides of the i-InGaAsP active layer 23 serving as a light emission region effectively confine an injection current in the i-InGaAsP active layer 23. The p-InP current blocking layers 25 play an important role for a high laser output. To enhance the current blocking effect, the current blocking layer must be heavily doped with an impurity.

In this conventional semiconductor laser, the p-InP current blocking layer 25 is heavily doped with an impurity to ensure a high breakdown voltage of the current blocking layer 25. In this case, however, since the p-InP current blocking layer 25 near the i-InGaAsP active layer 23 grows on a high-order plane such as the (311) plane or (211) plane which easily entraps an impurity element, the impurity concentration near the i-InGaAsP active layer 23 increases. That is, in the semiconductor laser, since the migration effect is prompted to grow the p-InP current blocking layer 25, as shown in FIG. 1B, the p-InP current blocking layer 25 near the i-InGaAsP active layer 23 grows on the (111)B plane at the start of growth, and sequentially grows on high-order planes such as the (311) plane and (211) plane owing to the migration effect.

In a general semiconductor laser, light emitted from the i-InGaAsP active layer 23 enters the p-InP current blocking layer 25 to a certain degree. Thus, if the impurity concentration of the p-InP current blocking layer 25 near the i-InGaAsP active layer 23 is high, the free carrier absorption loss in the p-InP current blocking layer 25 increases, failing to attain a high output. In addition, a high impurity concentration near the i-InGaAsP active layer 23 decreases the resistance, and a leakage current from the p-InP cladding layer 24 on the i-InGaAsP active layer 23 to the p-InP current blocking layer 25 tends to increase. This leakage current serves as a gate current to the pnpn current blocking thyristor, and a larger leakage current decreases the breakdown voltage of the blocking layer. Further, the impurity of the p-InP current blocking layer 25 is diffused to the i-InGaAsP active layer 23 to degrade characteristics and reliability due to impurity contamination.

Summary of the Invention

The present invention has been made in consideration of the above situation, and has as its object to provide a high-output semiconductor laser device with high reliability which can reduce the free carrier absorption loss in a current blocking layer and the leakage current, and a manufacturing method of the same.

To achieve the above object, according to the first aspect of the present invention, there is provided a semiconductor laser device comprising an active layer formed on a substrate, and current blocking layers formed on the substrate so as to sandwich the active layer, wherein each current blocking layer has a low impurity concentration at a portion near the active layer and a high impurity concentration at a portion apart from the active layer.

In the first aspect, the portion of the current blocking layer near the active layer is a region 1 to 2 $\mu$m and preferably not more than 1 $\mu$m apart from an end of the active layer.

In the first aspect, the current blocking layer has an impurity concentration of 3 to $5 \times 10^{17}$ cm$^{-3}$ at the portion near the active layer, and an impurity concentration of 7 to $10 \times 10^{17}$ cm$^{-3}$ at the portion apart from the active layer.

To achieve the above object, according to the second aspect of the present invention, there is provided a manufacturing method of a semiconductor laser device, comprising the steps of forming an active layer on a substrate, and selectively forming current blocking layers on the substrate by metal organic vapor phase epitaxy so as to sandwich the active layer, wherein a growth condition along the metal organic vapor phase epitaxy of each current blocking layer is determined such that an impurity concentration is low at a portion near the active layer and high at a portion apart from the active layer in the step of forming the current blocking layers.

In the second aspect, the first growth condition along the metal organic vapor phase epitaxy of the current blocking layer is to set a growth temperature in an initial stage of metal organic vapor phase epitaxy for the current blocking layer to be lower than a subsequent growth temperature. The second growth condition is to set a growth pressure in the initial stage of metal organic vapor phase epitaxy for the current blocking layer to be higher than a subsequent growth pressure. The third growth condition is to set a growth rate in the initial stage of metal organic vapor phase epitaxy for the current blocking layer to be higher than a subsequent growth rate. The fourth growth condition is to continuously supply a source gas of Group V in the initial stage of metal organic vapor phase epitaxy for the current blocking layer and to subsequently intermittently supply the source gas of Group V. The fifth growth condition is to increase a ratio of a source gas of Group III to a source gas of Group V in the initial stage of metal organic vapor phase epitaxy for the current blocking layer and to subsequently decrease the ratio.

As is apparent from these aspects, in the semiconductor laser device of the present invention, the impurity concentration of the current blocking layer near the active layer can be decreased without decreasing the breakdown voltage of the current blocking layer. Hence, the free carrier absorption loss in the current blocking layer can be reduced to obtain a high optical output and high reliability.

By adopting the manufacturing method of the semiconductor laser device according to the present invention, for example, the migration effect of a source species is suppressed at a portion near an i-InGaAsP active layer in the initial growth stage during formation (growth) of a p-InP current blocking layer. The p-InP current blocking layer keeps growing on the (111)B plane. To the contrary, the migration effect of the source species is prompted by changing crystal growth conditions at a portion apart from the active layer in the latter growth stage, and the current blocking layer grows on high-order planes such as the (311) plane and (211) plane. When the crystal growth plane is a high-order plane such as the (311) plane or (211) plane, a dangling bond is more readily formed during growth, and a larger amount of impurity is entrapped, compared to the (111)B plane having a very low growth rate. Therefore, the p-InP current blocking layer has a low impurity concentration near the active layer and a high impurity concentration at a portion apart from the active layer.

As described above, according to the present invention, since the impurity concentration of the current blocking layer near the active layer is relatively low, the free carrier absorption loss during propagation of light emitted by the active layer can be reduced. In addition, since the impurity concentration of the current blocking layer apart from the active layer is relatively high, the breakdown voltage of the current blocking layer can be kept high. Since the impurity concentration of the current blocking layer near the active layer is relatively low, the resistance near the active layer is high, and the leakage current flowing from an over cladding layer immediately above the active layer to the current blocking layer via a cladding layer can be reduced to increase the breakdown voltage of the current blocking layer. This can realize a high efficiency and high breakdown voltage, and can provide a high-optical-output semiconductor laser device. Moreover, since the impurity concentration of the current blocking layer in contact with the active layer is relatively low, diffusion of the impurity to the active layer can be suppressed. A semiconductor laser device with high reliability can be obtained.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENTS

Several preferred embodiments of the present invention will be described below with reference to the accompanying drawings.

Figure 1A:
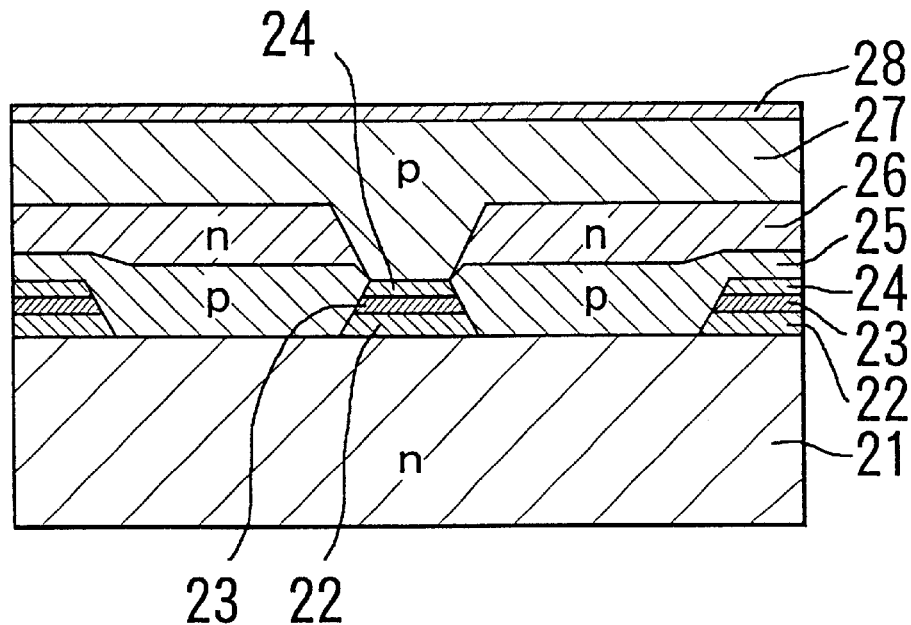
FIG. 1A is a sectional view showing an example of a conventional semiconductor laser device.
Figure 1B:
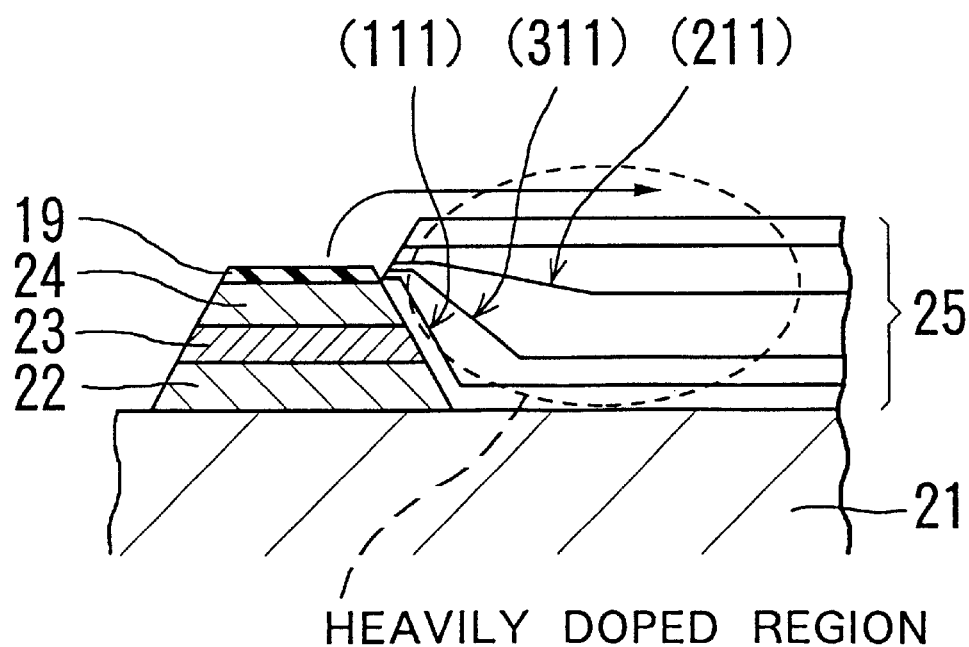
FIG. 1B is a sectional view showing the main part for schematically explaining a manufacturing method of a current blocking layer in the conventional semiconductor laser device.
Figure 2A:
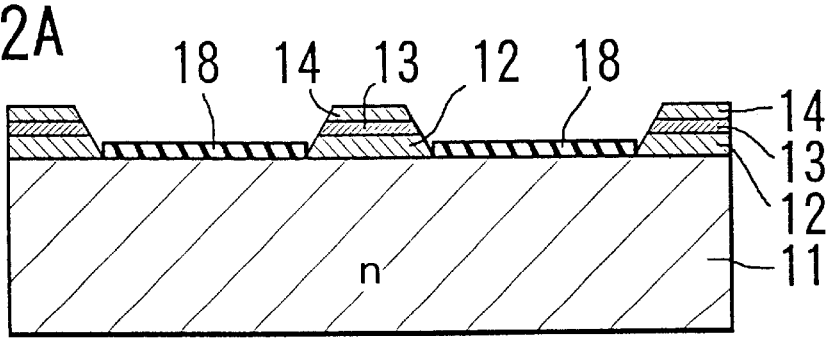
FIGS. 2A to 2D are sectional views, respectively, showing the steps in a manufacturing method of a semiconductor laser device according to the present invention.
Figure 2B:
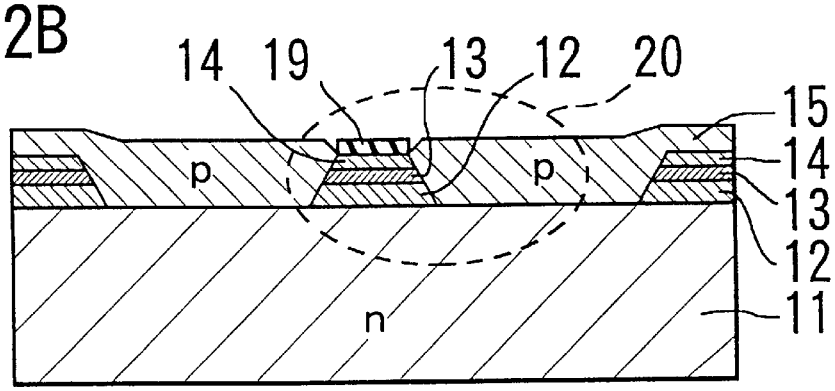

FIGS. 2A to 2D are sectional views, respectively, showing the steps in manufacturing a semiconductor laser device according to the present invention. As shown in FIG. 2A, a pair of $SiO_2$ stripe masks 18 are formed on an n-InP substrate 11, and used as growth stopper films to selectively form an n-InP cladding layer 12, i-InGaAsP active layer 13, and p-InP cladding layer 14 by metal organic vapor phase epitaxy (MOVPE). As shown in FIG. 2B, the $SiO_2$ growth stopper films 18 are removed, and an $SiO_2$ growth stopper film 19 is formed on only the p-InP cladding layer 14. P-InP current blocking layers 15 and n-InP current blocking layers 16 are selectively grown by MOVPE. This growth step will be described in detail.

Figure 3A:
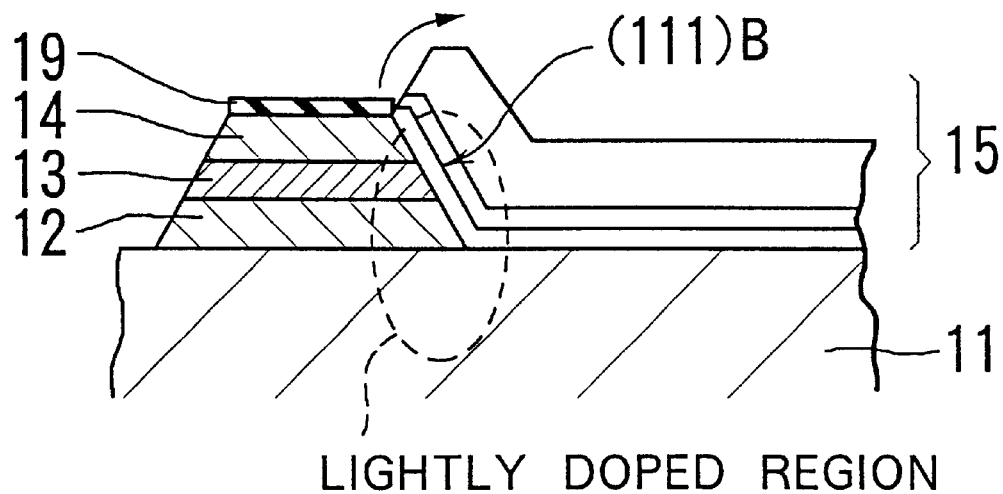
FIGS. 3A and 3B are sectional views for schematically explaining a manufacturing method of a current blocking layer in the semiconductor laser device according to the present invention.
Figure 3B:
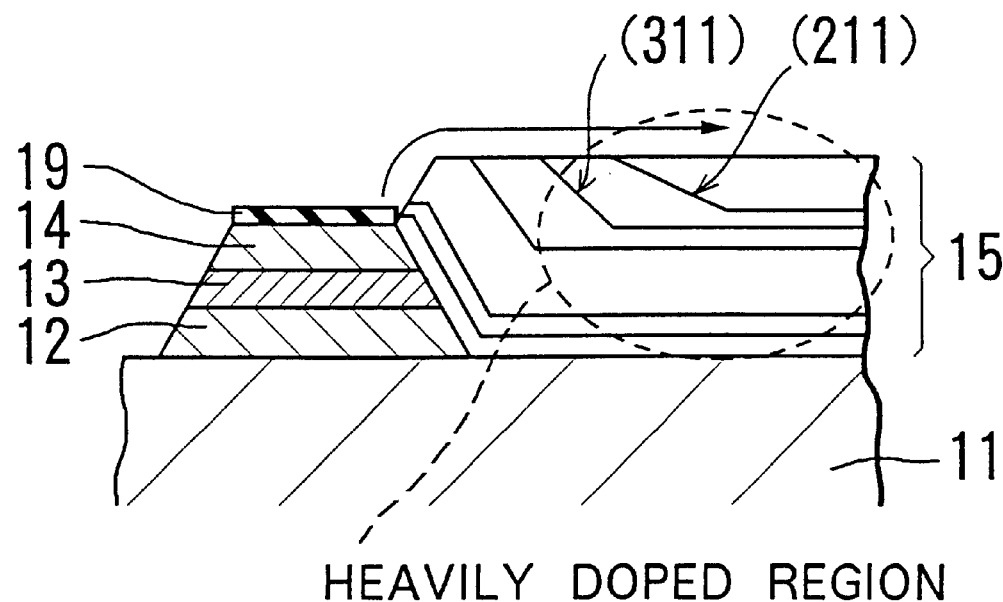

FIGS. 3A and 3B are enlarged views, respectively, showing a region 20 in FIG. 2B.

In the first embodiment, the growth temperature is set to 570° C. near the i-InGaAsP active layer 13, i.e., in the initial growth stage during the growth of the p-InP current blocking layer 15. This reduces the kinetic energy of a source species to suppress the migration effect. The p-InP current blocking layer 15 near the i-InGaAsP active layer 13 keeps growing on the (111)B plane. When the p-InP current blocking layer 15 grows to 1 to 2 μm and preferably 1 μm from the end of the i-InGaAsP active layer 13, i.e., in the latter growth stage, the growth temperature is increased to 650° C., thereby increasing the kinetic energy of the source species and prompting the migration effect. The source species having reached the p-InP current blocking layer formed on the (111)B plane does not grow on the (111)B plane having a very low growth rate, but migrates on the surface to sequentially grow on high-order planes such the (311) plane and (211) plane. When the crystal growth plane is a high-order plane such as the (311) plane or (211) plane, a dangling bond is readily formed during growth, and a larger amount of impurity (Zn in this embodiment) is entrapped. As a result, the impurity concentration of the p-InP current blocking layer 15 can be selectively changed to 3 to $5 \times 10^{17}$ $cm^{-3}$ near the i-InGaAsP active layer 13 and 7 to $10 \times 10^{17}$ $cm^{-3}$ in a region 1 to 2 μm apart from the i-InGaAsP active layer 13.

Figure 2C:
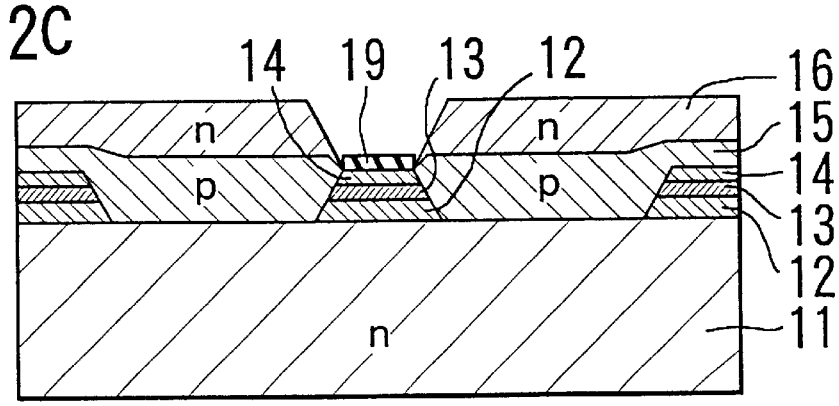
Figure 2D:
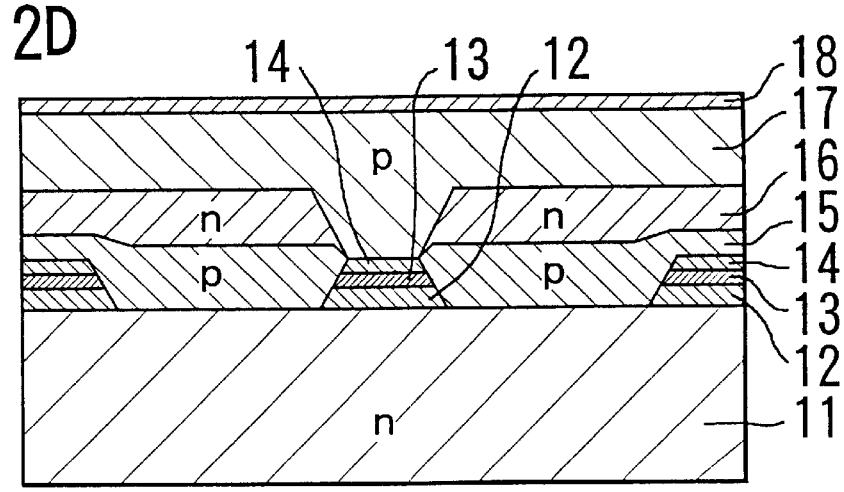

After the p-InP current blocking layers 15 have grown, n-InP current blocking layers 16 are formed on them, as shown in FIG. 2C. The $SiO_2$ growth stopper film 19 is removed, and a p-InP over cladding layer 17 and p-InGaAs capping layer 18 are grown on the entire surface by MOVPE, as shown in FIG. 2D, thereby completing the semiconductor laser device of the present invention.

In the semiconductor laser device manufactured in this manner, since the impurity concentration of the p-InP current blocking layer 15 near the i-InGaAsP active layer 13 is relatively low, the light absorption loss during propagation of light emitted by the i-InGaAsP active layer 13 can be reduced. In addition, since the impurity concentration of the p-InP current blocking layer 15 apart from the i-InGaAsP active layer 13 is high, the breakdown voltage of the current blocking layer can be kept high. Since the impurity concentration near the i-InGaAsP active layer 13 is relatively low, as described above, the resistance near the i-InGaAsP active layer 13 is high, and the leakage current flowing from the p-InP over cladding layer 17 to the p-InP current blocking layer 15 via the p-InP cladding layer 14 can be reduced. This leakage current serves as a gate current to the pnpn current blocking thyristor, so that a smaller leakage current can increase the breakdown voltage of the current blocking layer. These advantages can realize a high efficiency, high breakdown voltage, and high optical output. Moreover, since the impurity concentration of the p-InP current blocking layer 15 in contact with the i-InGaAsP active layer 13 is low, diffusion of the impurity to the i-InGaAsP active layer 13 can be suppressed. The semiconductor laser device can, therefore, obtain high reliability. A 1.48-μm semiconductor laser device with a conventional structure attains only an optical output of 180 mW for an oscillation threshold of 30 mA and a slope efficiency of 0.380 W/A and 500 mA. To the contrary, a 1.48-μm semiconductor laser device according to the first embodiment can attain an optical output of 200 mW for an oscillation threshold of 20 mA and a slope efficiency of 0.450 W/A and 500 mA.

The second to fifth embodiments in which the p-InP current blocking layer 15 is formed at a low impurity concentration near the i-InGaAsP active layer 13 and a high impurity concentration in a distant region will be described. In the second embodiment, while a p-InP current blocking layer 15 adjacent to an active layer is selectively grown by MOVPE, the growth pressure is relatively increased near an i-InGaAsP active layer 13 in the initial growth stage. For example, the growth pressure is increased to 150 Torr. This shortens the mean free paths of atoms and molecules to suppress the migration effect. Under weak migration effect, the p-InP current blocking layer 15 grows on the (111)B plane. In the latter growth stage, i.e., in a region apart from the i-InGaAsP active layer 13, the growth pressure is decreased to, e.g., 50 Torr. This suppresses decomposition of a source gas of Group III to prompt the migration effect on a semiconductor crystal surface. Under strong migration effect, the element which has reached the (111)B plane does not grow on the (111)B plane having a very low growth rate, but migrates on the semiconductor surface to sequentially grow on high-order planes such as the (311) plane and (211) plane. This manufacturing method can form the p-InP current blocking layer 15 which has a low concentration near the active layer and a high concentration in a region distant from the active layer on the basis of the same principle as the first embodiment.

In the third embodiment, while a p-InP current blocking layer 15 adjacent to an i-InGaAsP active layer 13 is selectively grown by MOVPE, the growth rate is relatively increased near the i-InGaAsP active layer 13 in the initial growth stage. For example, the growth rate is increased to 1.5 $\mu$m/h. A high growth rate is obtained by increasing the flow rate of a source gas of Group III. As a result, the mean free path of atoms of Group III is shortened to suppress the migration effect. Under weak migration effect, the p-InP current blocking layer grows on the (111)B plane. In the latter growth stage, i.e., in a region apart from the active layer 13, the growth rate is relatively decreased to, e.g., 0.75 $\mu$m/h. This prompts the migration effect on a semiconductor crystal surface. Under strong migration effect, the element which has reached the (111)B plane does not grow on the (111)B plane having a very low growth rate, but migrates on the semiconductor surface to sequentially grow on high-order planes such as the (311) plane and (211) plane. This manufacturing method can form the p-InP current blocking layer 15 which has a low concentration near the active layer 13 and a high concentration in a region distant from the active layer 13 on the basis of the same principle as the first embodiment.

In the fourth embodiment, while a p-InP current blocking layer 15 adjacent to an i-InGaAsP active layer 13 is selectively grown by MOVPE, a source gas of Group V is continuously supplied near the i-InGaAsP active layer 13 in the initial growth stage. This prompts decomposition of the source gas of Group III to suppress the migration effect. Under weak migration effect, the p-InP current blocking layer 15 grows on the (111)B plane. In the latter growth stage, i.e., in a region apart from the active layer 13, the source gas of Group V is intermittently supplied. For example, crystal growth is done in the cycle of a 1-sec supply time and 2-sec idle time. During the idle time, the mean free path of the element of Group III elongates to prompt the migration effect on a semiconductor crystal surface. Under strong migration effect, the element which has reached the (111)B plane does not grow on the (111)B plane having a very low growth rate, but migrates on the semiconductor surface to sequentially grow on high-order planes such as the (311) plane and (211) plane. This manufacturing method can form the p-InP current blocking layer 15 which has a low concentration near the active layer 13 and a high concentration in a region distant from the active layer 13 on the basis of the same principle as the first embodiment.

In the fifth embodiment, while a p-InP current blocking layer 15 adjacent to an i-InGaAsP active layer 13 is selectively grown by MOVPE, the ratio (V/III) of a source gas of Group V to a source gas of Group III is increased near the i-InGaAsP active layer 13 in the initial growth stage. For example, the ratio V/III is increased to 500. This prompts decomposition of the source gas of Group V, increases the partial pressure of the element of Group V, shortens the mean free path of the element of Group III, and suppresses the migration effect. Under weak migration effect, the p-InP current blocking layer 15 grows on the (111)B plane. In the latter growth stage, i.e., in a region apart from the active layer 13, the ratio V/III is decreased to, e.g., 100. This suppresses decomposition of the source gas of Group III to prompt the migration effect on a semiconductor crystal surface. Under strong migration effect, the element which has reached the (111)B plane does not grow on the (111)B plane having a very low growth rate, but migrates on the semiconductor surface to sequentially grow on high-order planes such as the (311) plane and (211) plane. This manufacturing method can form the p-InP current blocking layer 15 which has a low concentration near the active layer 13 and a high concentration in a region distant from the active layer 13 on the basis of the same principle as the first embodiment.

What is claimed is:

1. A manufacturing method of a semiconductor laser device, comprising the steps of forming an active layer on a substrate, and selectively forming current blocking layers on the substrate by metal organic vapor phase epitaxy so as to sandwich the active layer, wherein a growth condition is determined in accordance with a metal organic vapor phase epitaxy stage of each current blocking layer such that the current blocking layer near the active layer has a low impurity concentration in an initial stage of metal organic vapor phase epitaxy for the current blocking layer, and the current blocking layer apart from the active layer has a high impurity concentration in a subsequent metal organic vapor phase epitaxy stage, wherein the growth condition is to set a growth pressure in the initial stage of metal organic vapor phase epitaxy for the current blocking layer to be higher than a subsequent growth pressure.

2. A manufacturing method of a semiconductor laser device, comprising the steps of forming an active layer on a substrate, and selectively forming current blocking layers on the substrate by metal organic vapor phase epitaxy so as to sandwich the active layer, wherein a growth condition is determined in accordance with a metal organic vapor phase epitaxy stage of each current blocking layer such that the current blocking layer near the active layer has a low impurity concentration in an initial stage of metal organic vapor phase epitaxy for the current blocking layer, and the current blocking layer apart from the active layer has a high impurity concentration in a subsequent metal organic vapor phase epitaxy stage, wherein the growth condition is to set a growth pressure in the initial stage of metal organic vapor phase epitaxy for the current blocking layer to be higher than a subsequent growth pressure, and wherein the growth pressure in the initial stage of metal organic vapor phase epitaxy for the current blocking layer is 150 Torr, and the subsequent growth pressure is 50 Torr.

3. A manufacturing method of a semiconductor laser device, comprising the steps of forming an active layer on a substrate, and selectively forming current blocking layers on the substrate by metal organic vapor phase epitaxy so as to sandwich the active layer, wherein a growth condition is determined in accordance with a metal organic vapor phase epitaxy stage of each current blocking layer such that the current blocking layer near the active layer has a low impurity concentration in an initial stage of metal organic vapor phase epitaxy for the current blocking layer, and the current blocking layer apart from the active layer has a high impurity concentration in a subsequent metal organic vapor phase epitaxy stage, wherein the growth condition is to set a growth pressure in the initial stage of metal organic vapor phase epitaxy for the current blocking layer to be higher than a subsequent growth pressure, and wherein the growth condition is to set a growth rate in the initial stage of metal organic vapor phase epitaxy for the current blocking layer to be higher than a subsequent growth rate, and wherein the growth rate in the initial stage of metal organic vapor phase epitaxy for the current blocking layer is 1.5 $\mu$m/h, and the subsequent growth rate is 0.75 $\mu$m/h.

4. A manufacturing method of a semiconductor laser device, comprising the steps of forming an active layer on a substrate, and selectively forming current blocking layers on the substrate by metal organic vapor phase epitaxy so as to sandwich the active layer, wherein a growth condition is determined in accordance with a metal organic vapor phase epitaxy stage of each current blocking layer such that the current blocking layer near the active layer has a low impurity concentration in an initial stage of metal organic vapor phase epitaxy for the current blocking layer, and the current blocking layer apart from the active layer has a high impurity concentration in a subsequent metal organic vapor phase epitaxy stage, wherein the growth condition is to set a growth pressure in the initial stage of metal organic vapor phase epitaxy for the current blocking layer to be higher than a subsequent growth pressure, and wherein the growth condition is to set a growth rate in the initial stage of metal organic vapor phase epitaxy for the current blocking layer to be higher than a subsequent growth rate, and wherein the growth condition is to increase a ratio of a source gas of Group III to a source gas of Group V in the initial stage of metal organic vapor phase epitaxy for the current blocking layer and to subsequently decrease the ratio, and wherein the ratio of the source gas of Group III to the sources gas of Group V in the initial stage of metal organic vapor phase epitaxy for the current blocking layer is 500, and the subsequent ratio is 100.

* * * * *